(12) United States Patent
Ammer et al.

(10) Patent No.: US 7,340,013 B2
(45) Date of Patent: Mar. 4, 2008

(54) SOFT SAMPLE SCALING IN A TURBO DECODER

(75) Inventors: Gerhard Ammer, Munich (DE); Jan-Enno F. Meyer, Weilheim (DE); Shuzhan Xu, Coplay, PA (US)

(73) Assignee: Agere Systems Inc., Allentown, PA (US)

( * ) Notice: Subject to any disclaimer, the term of this patent is extended or adjusted under 35 U.S.C. 154(b) by 793 days.

(21) Appl. No.: 10/279,770

(22) Filed: Oct. 24, 2002

(65) Prior Publication Data

US 2004/0081259 A1   Apr. 29, 2004

(51) Int. Cl.
*H03D 1/00* (2006.01)

(52) U.S. Cl. .................. 375/340; 375/341; 375/130; 375/148; 370/476; 327/349

(58) Field of Classification Search ............... 375/340, 375/341, 130, 148; 370/476; 327/349
See application file for complete search history.

(56) References Cited

U.S. PATENT DOCUMENTS 6,377,607 B1 * 4/2002 Ling et al. ................. 375/130
6,393,076 B1 * 5/2002 Dinc et al. .................. 375/341
7,042,929 B2 * 5/2006 Pan et al. ................... 375/148
2004/0071231 A1 * 4/2004 Lin et al. .................... 375/341
2004/0076184 A1 * 4/2004 Tene et al. .................. 370/476

OTHER PUBLICATIONS

T.Fujiwara, A TD-CDMA Data Collection System for City Lifeline Monitoring, 2000, IEEE, 1630-1635.*

* cited by examiner

*Primary Examiner*—Chieh M. Fan
*Assistant Examiner*—Eva Zheng
(74) *Attorney, Agent, or Firm*—Steve Mendelsohn; Kevin M. Drucker (57) ABSTRACT

A receiver for iterative decoding of a received, encoded signal employs slot-based scaling of soft samples. Iterative decoding employs a constituent maximum a priori (MAP) decoder for each constituent encoding of information of the encoded signal. Root mean square (RMS) values for soft samples over a slot are selected for dynamic range scaling. Squared RMS values are combined and equal the squared RMS value for a frame multiplied by a control constant, and this relationship may be employed to derive scaling constants for each slot. Alternatively, the square root of the RMS value multiplied by a constant serves as an SNR estimator that may be employed to scale samples to reduce dynamic range and modify logarithmic correction values for max* term calculation during log-MAP decoding.

29 Claims, 2 Drawing Sheets

SOFT SAMPLE SCALING IN A TURBO DECODER

BACKGROUND OF THE INVENTION

1. Field of the Invention

The present invention relates to decoding of encoded and transmitted data in a communication system, and, more particularly, to scaling samples input to maximum a priori (MAP) decoding algorithms.

2. Description of the Related Art

MAP algorithms are employed for processing a channel output signal applied to a receiver. MAP algorithms may be used for both detection (to reconstruct estimates for transmitted symbols) and decoding (to reconstruct user data). A MAP algorithm provides a maximum a posteriori estimate of a state sequence of a finite-state, discrete-time Markov process observed in noise. A MAP algorithm forms a trellis corresponding to possible states (portion of received symbols or data in the sequence) for each received output channel sample per unit increment in time (e.g., clock cycle).

A trellis diagram may represent states, and transitions between states, of the Markov process spanning an interval of time. The number of bits that a state represents is equivalent to the memory of the Markov process. Thus, probabilities (sometimes of the form of log-likelihood ratio (LLR) values) are associated with each transition within the trellis, and probabilities are also associated with each decision for a sample in the sequence. These LLR values are also referred to as reliability information.

A processor implementing a MAP algorithm computes LLR values using α values (forward state probabilities for states in the trellis and also known as a forward recursion) and β values (reverse state probabilities in the trellis and also known as a backward recursion), as described subsequently. The α values are associated with states within the trellis, and these α values are stored in memory. The processor using a MAP algorithm computes values of β, and the α values are then retrieved from memory to compute the final output LLR values.

The variable S is defined as the possible state (from a set of M possible states $$\{s_p\}_{p=0}^{M-1})$$

of the Markov process at time i, $y_i$ is defined as the noisy channel output sample at time i, and the sample sequence $y^K$ is defined as the sequence of length K of noisy channel output samples $$\{y_i\}_{i=0}^{K-1}.$$

Therefore, $y_i^K$ is the noisy channel output sample $y_i$ at time i in a given sequence $y^K$ of length K. For a data block of length K, probability functions at time i may be defined for the Markov process as given in equations (1) through (3):

$$\alpha_s^i = p(S=s;\ y_i^K) \quad (1)$$

$$\beta_s^i = p(y_{i+1}^K | S=s) \quad (2)$$

$$\gamma_{s',s}^i = p(S=s;\ y_i^K | S'=s'). \quad (3)$$

where S is the Markov process variable at time i, S' is the Markov process variable at time i-1, s is the observed state of S of the Markov process at time i, and s' is the observed state of S' of the Markov process at time i-1.

The log-likelihood ratio (LLR) value $L(u_i)$ for a user's symbol $u_i$ at time i may then be calculated as given in equation (4):

$$L(u_i) = \log\left(\frac{p(u_i = +1|y_i^K)}{p(u_i = -1|y_i^K)}\right). \quad (4)$$

Defining $\alpha_1^i$ and $\beta_1^i$ from equations (1) and (2) as the forward and backward recursions (probabilities or state metrics) at time i in state s=1, respectively, and defining $\gamma_{m,i}^l$ as the branch metric associated with the transition from state m at time i-1 to state l at time i, then the forward recursion for states is given in equation (5):

$$\alpha_l^i = \sum_{l \in S} \alpha_l^{i-1} \gamma_{m,l}^i, \quad (5)$$

where l ∈ S is a set of states at time i-1 which have a valid transition to the state l at time i.

Similarly, the backward recursion for states is given in equation (6):

$$\beta_l^{i-1} = \sum_{m \in S} \beta_m^i \gamma_{l,m}^i, \quad (6)$$

where m ∈S is a set of states at time i which have a valid transition from the state l to the state m at time i-1.

Once the forward and backward recursions for states are calculated, equation (4) is employed to generate the log-likelihood value (also known as reliability value) $L(u_i)$ for each user symbol $u_i$. Thus, equation (4) may be re-written as given in equation (7):

$$L(u_i) = \log\left(\frac{\sum_{(l,m) \in S^+} \alpha_l^{i-1} \gamma_{l,m}^i \beta_m^i}{\sum_{(l,m) \in S^-} \alpha_l^{i-1} \gamma_{l,m}^i \beta_m^i}\right) \quad (7)$$

where a state pair (l, m) ∈ $S^+$ is defined as a pair that has a transition from state l at time i-1 to state m at time i corresponding to the user symbol $u_i$="1", and a state pair (l, m) ∈ $S^-$ is similarly defined as a pair that has a transition from state l at time i-1 to state m at time i corresponding to the user symbol $u_i$="-1".

A MAP algorithm may be defined by substituting $A_m^i$=log($\alpha_m^i$), $B_m^i$=log($\beta_m^i$), and $\Gamma_{l,m}$=log($\gamma_{l,m}^i$) into the equations (5), (6), and (7). Such substitution is sometimes referred to as the log-MAP algorithm. Also, with the relation that log($e^{-x}+e^{-y}$) is equivalent to max(x,y)+log($e^{-|x-y|}$+1), the forward and backward recursions of the log MAP algorithm may be described as in equations (8) and (9):

$$A_m^i = \max_{l \in S} * (A_l^{i-1} + \Gamma_{l,m}^i) \quad (8)$$

$$B_l^{i-1} = \max_{m \in S} * (B_m^{i-1} + \Gamma_{l,m}^i) \quad (9)$$

where max* (x, y) is defined as max(x, y)+log((e$^{-|x-y|}$)+1). Note that equations (8) and (9) may include more than two terms in the max*(●, . . . , ●) operator, so a max*(x, y, . . . , z) operation may be performed as a series of pairs of max*(●,●) calculations. Max(x, y) is defined as the "max term" and log((e$^{-|x-y|}$)+1) is defined as the "logarithmic correction term."

One application of the MAP algorithm is a form of iterative decoding termed "turbo decoding," and a decoder employing turbo decoding of data encoded by a turbo encoder is generally referred to as a turbo decoder. Turbo encoding is an encoding method in which two identical constituent encoders separated by an interleaver are used to encode user data. A commonly employed code rate for the turbo encoder is ⅓ and for each constituent encoder is ½.

The turbo encoder of a transmitter generates three sequences. The sequence $$\{x_i\}_{i=0}^{L-1}$$

represents the transmitted information bit sequence, the sequences $\{p_i\}_{i=0}^{L-1}$ and $\{q_i\}_{i=0}^{L-1}$ represent the parity bit sequences of the first and the second constituent encoders, respectively. These three sequences (bit streams) are combined and transmitted over a channel characterized by Rayleigh fading factors $\alpha_i$ and added Gaussian noise variance $$\sigma^2 = \frac{N_0}{2}.$$

Turbo decoding at a receiver employs "soft-input, soft-output" (SISO) constituent decoders separated by a de-interleaver and an interleaver to iteratively decode the turbo encoded user data. For example, the first constituent decoding employs the original input sample sequence, while an interleaver is employed to interleave the original input sample sequence for the second constituent decoding. The de-interleaver is employed to de-interleave the soft decisions of the first constituent decoding that are then used by the second constituent decoding, and the interleaver is employed to re-interleave the soft decisions after the second constituent decoding for the first constituent decoding.

At the receiver, the signal from the channel is sampled to yield the sequence (receive samples) as given in equation (10):

$$\{y_i\}_{i=0}^{K-1} = \{\alpha_i x_i \sqrt{E_s} + n_i\}_{i=0}^{K-1}, \{t_i\}_{i=0}^{K-1} = \{\alpha_i p_i \sqrt{E_s} + n_i'\}_{i=0}^{K-1} \text{ and } \{t_i'\}_{i=0}^{K-1} = \{\alpha_i q_i \sqrt{E_s} + n_i''\}_{i=0}^{K-1}, \quad (10)$$

where K is frame size, $E_s$ is the energy of a sample, and $\{n_i, n_i', n_i''\}$ are the added noise components. Each constituent SISO decoder generates a series of log-likelihood ratio (LLR) values $$\{L_i\}_{i=0}^{K-1}$$

using the sequence of input samples $$\{y_i\}_{i=0}^{K-1},$$

input extrinsic (a priori) information $$\{z_i\}_{i=0}^{K-1}$$

(received from an interleaver or de-interleaver, depending on the constituent decoder), and newly generated extrinsic information $$\{l_i\}_{i=0}^{K-1}$$

to be applied to either the interleaver or de-interleaver (depending on the constituent decoder) for the next iteration. The ith LLR value $L_i$ is generated according to equation (11):

$$L_i = \frac{2\alpha_i \sqrt{E_s}}{\sigma^2} y_i + z_i + l_i. \quad (11)$$

From equation (11), one skilled in the art would recognize that it is desirable to scale the received samples that are employed to generate extrinsic information. Such scaling is desirably based on the signal-to-noise ratio (SNR) values, since with each iteration the LLR values are each increasing by an amount related to the SNR value. Consequently, the samples of a slot are divided by a scaling factor that is proportional to the SNR of the observed input samples.

For turbo decoding, an estimate of a scaling value is generated and applied to input samples to avoid severe performance degradation of the decoder. Scaling in the turbo decoder using log-MAP decoding is required for the logarithmic correction term (typically implemented via a look-up table). One method employed in the prior art to scale soft samples properly uses a fixed-value look-up table, and another method programs the values within the look-up table according to SNR estimation. Finally, a combination of these two methods scales the soft samples with a control constant to program the look-up table entries. Fixed-point precision issues arise when scaling and adjusting values in the look-up table.

For a given implementation, the dynamic range is also modified for efficient soft sample representation. In finite precision format, each scaling operation represents re-quantization, which has a corresponding truncation error and saturation error. Thus, an estimator desirably provides SNR values both as a scaling factor for the max* (log-MAP) decoding as well as a scaling factor used to adjust the dynamic range of the input soft samples toward a desired dynamic range. These two estimated factors are ideally the same. Power control and automatic gain control (AGC) of the receiver are also affected by scaling, and so the estimator should reflect differences in transmission power. For relatively good SNR estimation generated locally in real time, the estimator needs to be short, but a short estimator generally produces more estimation errors.

In addition to the interleaving of the turbo encoder, channel interleaving of the encoded data at the transmitter may be employed to randomly distribute burst errors of the channel through a de-interleaved sequence representing the encoded data. This process is distinguished herein as "channel interleaving" and "channel de-interleaving." Since the soft sample sequence after channel de-interleaving does not reflect the time order of channel propagation, estimators and scaling methods tend to exhibit a random nature (i.e., processing after channel de-interleaving is virtually a "blind" estimation approach). Thus, scaling is often applied before channel de-interleaving to reflect the natural propagation order. In CDMA systems, a RAKE receiver demands higher bit precision (higher number of bits) for data path processing, while a turbo decoder requires lower bit precision. Reduction of bit precision is accomplished using digital re-quantization that is typically done before de-interleaving the input samples. Therefore, scaling is preferably applied before this re-quantization (or the scaling factors estimated prior to requantization) for accuracy. Typically, a turbo decoder tolerates more overestimation than underestimation. For some systems, accuracy of SNR estimates to within −2 dB and 6 dB is required to achieve acceptable performance degradation in static channel.

Down-link power control schemes in UMTS WCDMA systems include a base station that adjusts its transmitting power, with certain delay, according to the received TPC (transmitting power control) bit. Power control may be defined over groups of bits, and, for example, power control of the transmitted signal may be updated 1500 times per second. A slot is defined as a unit time duration of one fixed transmission power control, which for the example is 1/1500 second. In short, the transmitting power remains constant only for a slot and is constantly in change slot by slot.

The down-link power for kth slot is adjusted according to equation (12):

$$P(k)=P(k-1)+P_{TPC}(k)+P_{bal}(k), \quad (12)$$

where $P_{TPC}(k)$ is the power adjustment due to inner loop power control, and $P_{bal}(k)$ is the correction according to the down-link power control procedure for balancing radio link power to a common reference power. The value for $P_{TPC}(k)$ is given in equations (13) through (17) as follows:

A) if the value of Limited Power Raise Used parameter is 'Not used', then $$P_{TPC}(k)=+\Delta_{TPC}, \text{ if } TPC_{est}(k)=1, \quad (13)$$

$$P_{TPC}(k)=-\Delta_{TPC}, \text{ if } TPC_{est}(k)=0, \quad (14)$$

B) else if the value of Limited Power Raise Used parameter is 'Used', then $$P_{TPC}(k)=+\Delta_{TPC}, \text{ if } TPC_{est}(k)=1 \text{ and } \Delta_{sum}(k)+\Delta_{TPC}<\text{Power\_Raise\_Limit}, \quad (15)$$

$$P_{TPC}(k)=0, \text{ if } TPC_{est}(k)=1 \text{ and } \Delta_{sum}(k)+\Delta_{TPC}\geq\text{Power\_Raise\_Limit}, \quad (16)$$

$$P_{TPC}(k)=-\Delta_{TPC}, \text{ if } TPC_{est}(k)=0, \quad (17)$$

where the value $\Delta_{sum}(k)$ is the temporary sum of the last inner loop power adjustments given in equation (18):

$$\Delta_{sum}(k) = \sum_{i=k-\text{DLPA\_Window\_Size}+1}^{k-1} P_{TPC}(i), \quad (18)$$

and DLPA_Window_Size is the length of the sample window used for an update. The power control step size $\Delta_{TPC}$ may comprise, for example, one of four values: 0.5, 1.0, 1.5 or 2.0 dB.

Scaling factors derived with inter-slot estimation methods average out a portion of the noise perturbation in the transmitted signal. Inter-slot estimation is also related to the corresponding transmitter power control method. Defining $$\frac{\hat{E}_s}{N_0}(i)$$

as the estimated online SNR for the ith slot, equation (19) yields an average SNR of the ith slot (SNR(i)) for the final scaling factor:

$$SNR(i) = \lambda_1 \frac{\hat{E}_s}{N_0}(i) + \lambda_2 \left\{ \frac{\hat{E}_s}{N_0}(i-1) + P_{TPC}(i) + P_{bal}(i) \right\}, \quad (19)$$

where $\lambda_1$ and $\lambda_2$ are positive numbers that add to one (that is $\lambda_1+\lambda_2=1$). When $\lambda_1=0$ and $\lambda_2=1$, the online SNR for this slot is purely based on the previous estimation and the power control adjustment. On the other hand, when $\lambda_1=1$ and $\lambda_2=0$, no estimation of the previous slot is used. For this case, the scaling factor SNR(i) becomes slot-based and dependent upon the SNR of the slot modified in accordance with the power control.

SUMMARY OF THE INVENTION

In accordance with embodiments of the present invention, iterative decoding of a received, encoded signal employs slot-based scaling of soft samples. Iterative decoding employs a constituent maximum a priori (MAP) decoder for each constituent encoding of information of the encoded signal. Root mean square (RMS) values for soft samples over a slot are selected for dynamic range scaling. Squared RMS values are combined and equal the squared RMS value for a frame multiplied by a control constant, and this relationship may be employed to derive scaling constants used with RMS values for each slot. Alternatively, the square root of the RMS value multiplied by a constant serves as an SNR estimator that may be employed to scale samples to reduce dynamic range and modify logarithmic correction values for max* term calculation during log-MAP decoding.

In accordance with an exemplary embodiment of the present invention, a receiver scales samples of an encoded signal iteratively decoded to generate decoded data by: (a) generating a root mean square (RMS) value for samples within a slot; (b) calculating a scaling factor based on the RMS value of the slot; and (c) scaling the input samples of the slot based on the scaling factor.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

In accordance with exemplary embodiments of the present invention, a receiver for iterative decoding of a received, encoded signal employs slot-based scaling of soft samples. Iterative decoding employs a constituent maximum a priori (MAP) decoder for each constituent encoding of information of the encoded signal. Root mean square (RMS) values for soft samples over a slot are selected for dynamic range scaling. Squared RMS values are combined and equal the squared RMS value for a frame multiplied by a control constant. The RMS value with control constant serves as an SNR estimator that may be employed to scale logarithmic correction values for max* term calculation during log-MAP decoding. Slot-based RMS scaling in accordance with an exemplary embodiment of the present invention requires relatively short calculation (or access if calculated and stored in a look-up table), may be relatively easily determined during CDMA receiver processing without introducing substantial latency, and may be flexibly implemented within the CDMA receiver.

Figure 1:
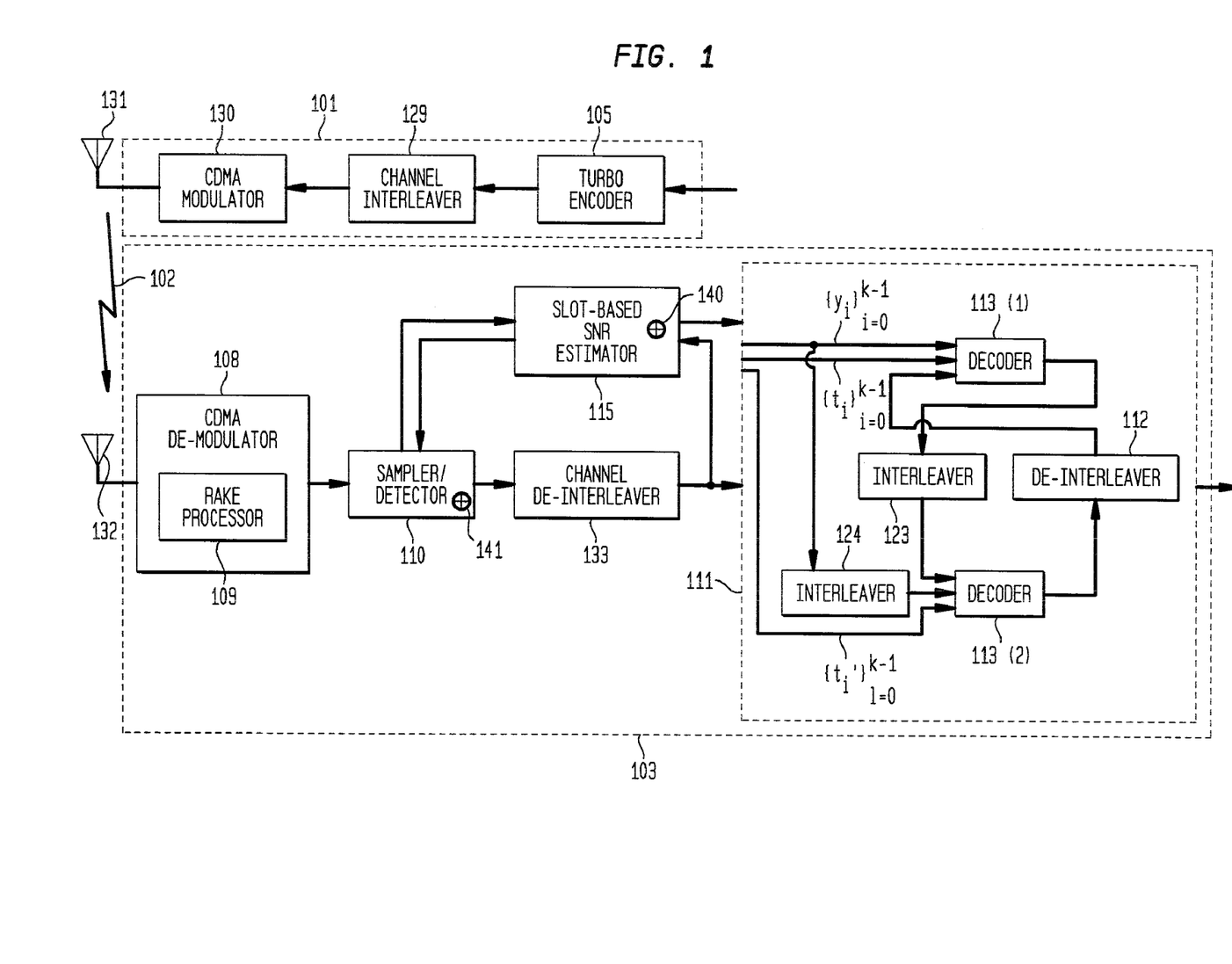
FIG. 1 shows a transmitter passing an encoded and modulated signal through a channel to a receiver employing iterative decoding with slot-based RMS scaling in accordance with one or more embodiments of the present invention.

FIG. 1 shows transmitter 101 passing an encoded and modulated signal through channel 102 to receiver 103. Transmitter 101 includes turbo encoder 105, channel interleaver 129, and CDMA modulator 130. Systematic turbo encoder 105 performs parallel concatenation of two identical constituent convolutional encoders separated by an interleaver. Each constituent convolutional encoder employs a recursive systematic code (RSC). For example, the overall code rate of the turbo encoder may be ⅓ when the code rate for each constituent convolutional encoder is ½. For a block of length K encoded by a block encoder, the sequence $$\{x_i = m_i\}_{i=0}^{K-1}$$

is defined as a sequence of information bits, and the sequences $$\{p_i\}_{i=0}^{K-1} \text{ and } \{p'_i\}_{i=0}^{K-1}$$

are defined as the parity bit sequences of the first and the second constituent encoders, respectively.

Turbo encoder 105 in transmitter 101 operates to produce a frame of encoded data. A frame is encoded data within a predefined, fixed time duration of transmitted coded bits; consequently, the number of encoded bits in a frame varies depending upon the user data rate. At transmitter 101, power control may also be employed in the transmitted signal. Power control may be defined over groups of bits, and, for example, power control of the transmitted signal may be updated 1500 times per second. A slot is defined as a unit time duration of one fixed transmission power control, which for the example is $1/1500$ second.

The coded bits of the frame are interleaved by channel interleaver 129. Interleaving of the encoded data, when de-interleaved at the receiver, spreads burst errors inserted in channel 102 within the de-interleaved encoded data stream, which may aid in single bit-error detection and correction performed by receiver 103. The interleaved encoded data stream is modulated by CDMA modulator 130 and transmitted, via antenna 131, as a modulated signal through channel 102. Channel 102 may be a wireless communication channel for CDMA modulation, but one skilled in the art may extend the present invention to systems for other channels, such as magnetic recording channels. In addition, one skilled in the art may extend the teachings herein to systems having signals modulated using other common modulation techniques, such as QAM, VSB, or PAM. While not shown explicitly in FIG. 1, transmitter 101 includes components and other systems well known in the art to modulate and transfer the signal to the channel.

Receiver 103 includes CDMA demodulator 108 having RAKE processor 109, sampler/detector 110, channel de-interleaver 133, slot-based SNR estimator 115, and turbo decoder 111. CDMA demodulator 108 processes the signal sensed from channel 102 through antenna 132. CDMA demodulator 108 reverses the process of CDMA modulation by a transmitter, with RAKE processor 109 combining demodulated multi-path signals to improve overall signal-to-noise ration (SNR) of the received, demodulated signal. Sampler/detector 110 detects timing and samples the signal received from CDMA demodulator 108 to generate output channel samples. While not shown explicitly in FIG. 1, receiver 103 includes components and other systems well known in the art to aid in reception and demodulation of the signal from channel 102.

Channel de-interleaver 133 de-interleaves the output channel samples to reverse the interleaving of channel interleaver 129. Slot-based SNR estimator 115 generates scaling factors for slot-based scaling of soft samples in accordance with one or more embodiments of the present invention. Slot-based SNR estimator 115 receives samples for a slot either from 1) sampler/detector 110 or 2) channel de-interleaver 133, depending on the form of scaling factor desired. Slot-based SNR estimator 115 may comprise a combiner 140 for combining the received sample values and a processor for calculating the scaling factor based on various methods, as described below. Once scaling factors are generated, scaling of samples may occur either prior to channel de-interleaving (i.e., by a combiner (not shown) in the RAKE processor 109 or a combiner 141 in sampler/detector 110) or after channel de-interleaving (i.e., by a combiner (not shown) in turbo decoder 111). Generation of scaling factors by slot-based SNR estimator 115 is described below.

Turbo decoder 111 is employed by receiver 103 to reconstruct the user information or data from the received output channel samples (after channel de-interleaving). Turbo decoder 111 employs a turbo decoding scheme based on one or more log-MAP decoding algorithms. Turbo decoder 111 includes constituent (log-)MAP decoders 113(1) and 113(2), de-interleaver 112, interleaver 123, and interleaver 124. Turbo decoder 111 employs iterative decoding, (i.e., repetitively decoding the sequence of output channel samples with two or more iterations) with each iteration comprising a series of constituent MAP decoding operations. Each constituent MAP decoding of an iteration corresponds to a constituent encoding of the transmitter 101. Thus, during each iteration of decoding, all of the constituent encodings are reversed. MAP decoders 113(1) and 113(2) each applies a corresponding constituent MAP decoding operation using a log-MAP algorithm. Each constituent MAP decoding operation generates soft decisions for received user bits and a set of LLR values corresponding to the soft decisions. Information generated by one constituent MAP decoding may be used by the next constituent MAP decoding operation.

For an additive white Gaussian noise (AWGN) channel having noise (power) variance $$\sigma^2 = \frac{N_0}{2},$$

the observed output channel samples have the form of $$\{y_i\}_{i=0}^{K-1} = \{x_i\sqrt{E_s} + n_i\}_{i=0}^{K-1},$$

$$\{t_i\}_{i=0}^{K-1} = \{p_i\sqrt{E_s} + n'_i\}_{i=0}^{K-1} \text{ and } \{t'_i\}_{i=0}^{K-1} = \{p'_i\sqrt{E_s} + n''_i\}_{i=0}^{K-1}.$$

As is known in the art, decoding by each constituent MAP decoder generates the LLR value $L_i$ for time i from equation (7), which may be considered to have three components as given before in equation (11):

$$L_i = \frac{2\sqrt{E_s}}{\sigma^2} y_i + z_i + l_i, \quad (11)$$

where $$\{L_i\}_{i=0}^{K-1}$$

is the sequence of LLR values for the sequence $$\{y_i\}_{i=0}^{K-1},$$

and $E_s$ is the energy of a sample (note that the $\alpha=1$ in equation (11) if a fading (Raleigh) channel is considered). In equation (11), the right hand term as a function of sample $y_i$ corresponds to the soft decision, $z_i$ is the input a priori extrinsic information from the previous constituent MAP decoding operation (which may be zero for the first iteration), and $$\{l_i\}_{i=0}^{K-1}$$

is the sequence of newly generated extrinsic information for the next constituent MAP decoding operation.

Returning to FIG. 1, MAP decoder 113(1) receives the sequence $$\{y_i\}_{i=0}^{K-1}$$

corresponding to the encoded user data with noise, as well as the sequence $$\{t_i\}_{i=0}^{K-1}$$

corresponding to the parity bits with noise for the first constituent encoding. In addition, MAP decoder 113(1) receives extrinsic information from MAP decoder 113(2). However, since the encoding of the user data is separated by interleaving, the output of MAP decoder 113(2) is first de-interleaved by de-interleaver 112. Similarly, MAP decoder 113(2) receives the sequence $$\{y_i\}_{i=0}^{K-1}$$

corresponding to the encoded user data with noise, as well as the sequence $$\{t'_i\}_{i=0}^{K-1}$$

corresponding to the parity bits with noise for the second constituent encoding. Again, since the first and second constituent encodings are separated by an interleaver, the sequence $$\{y_i\}_{i=0}^{K-1}$$

is first interleaved by interleaver 124 before application to MAP decoder 113(2). MAP decoder 113(2) also receives interleaved extrinsic information generated by MAP decoder 113(1) from interleaver 123.

One-step, slot-based RMS scaling in accordance with an exemplary embodiment of the present invention is now described. An overall scaling control constant for all slots is defined in order to provide flexibility for modifying entries of a logarithmic correction look-up table (LUT). The following description assumes an additive white Gaussian noise (AWGN) channel (i.e., the Rayleigh channel with variance $\alpha_j=1$), though one skilled in the art may extend the teachings herein to other types of channels (e.g., Rayleigh channels with $\alpha_j>1$) with different noise characteristics. The sequence $$\{\xi_i\}_{i=0}^{3K-1} = \{y_i, t_i, s_i\}_{i=0}^{K-1}$$

is defined as the input soft samples, where the energy of the ith input soft sample $\xi_i$ is given in equation (20):

$$E[|\xi_i|^2] = E_s + \sigma^2, \quad (20)$$

where E[●] denotes mathematical "expected value of."

For low SNR, the sample energy $E_s$ is nearly 0, and so $E[|\xi_i|^2] \approx \sigma^2$. The root mean square (RMS) value over the ith slot ($RMS_i$) may be calculated as in equation (21):

$$RMS_i = \frac{1}{3K} \sum_{i=0}^{3K-1} |\xi_i|^2 \approx E[|\xi_i|^2] \approx \sigma^2, \quad (21)$$

where, as before, K is the number of samples per block, which is set to the length of a slot. Therefore, the RMS value over a slot may be employed as a noise variance estimator, which is relatively accurate for input signals having relatively low SNR.

A set of T slots in a frame includes the following sequences of soft samples: $((\xi_0, \xi_1, \ldots, \xi_{3K-1}), (\xi_{3K}, \xi_{3K+1}, \ldots, \xi_{6K-1}), \ldots, (\xi_{3(T-T-1)K+1}, \ldots, \xi_{3TK-1}))$. For these T slots, SNR scaling factors are defined as the sequence $$\{C_i\}_{i=0}^{T-1},$$

where $C_i$ is the estimated scaling factor for the ith slot. The RMS value over the whole frame after slot by slot scaling ($RMS^1$) is given in equation (22):

$$RMS^1 = \frac{1}{T} \sum_{i=0}^{T-1} \{C_i^2 RMS_i\}, \quad (22)$$

where $RMS_i$ is the RMS value over the ith slot. The $RMS_i$ for a slot may be measured or calculated at the receiver using the received sample sequence. For reference, the RMS value over a whole frame before slot-based scaling is given in equation (23):

$$RMS^0 = \frac{1}{T} \sum_{i=0}^{T-1} RMS_i. \quad (23)$$

Since scaling is desired to stabilize channel impairment effects and to adjust soft samples into a desired dynamic range for a fixed-point implementation, the RMS value over the frame after scaling is preferably a fixed constant C, (i.e., $RMS^1=C$). For a given implementation, the constant C may be determined through one or more of simulation, measurement of a system, and off-line calculation.

For a first exemplary embodiment of scaling, one selection of each slot-based scaling factor $C_i$ is given in equation (24):

$$C_i = \frac{\sqrt{C}}{\sqrt{RMS_i}}, \quad (24)$$

which provides a relation between the slot-based scaling factors $C_i$ and the overall control constant C.

For a second exemplary embodiment of scaling in which the sample energy $E_s$ is not negligible, noise variance estimation is employed. In noise variance estimation, the square root RMS value (i.e., $\sqrt{RMS_i}$) is employed as a scaling factor to generate an output data stream with constant RMS value. The slot-based SNR scaling factor for noise variance estimation is given in equation (25):

$$\frac{2\sqrt{E_s}}{\sigma^2} \approx \frac{2\sqrt{E_s}}{RMS_i - E_s} = \frac{2\sqrt{E_s}}{(\sqrt{RMS_i} + \sqrt{E_s})(\sqrt{RMS_i} - \sqrt{E_s})} \quad (25)$$

$$= \frac{2}{(\sqrt{RMS_i} + \sqrt{E_s})\left(\frac{RMS_i}{E_s} - 1\right)}$$

$$= \frac{D_i}{\sqrt{RMS_i}} \approx \frac{C_i}{\sqrt{RMS_i}},$$

where $D_i$ represents a constant. As indicated in equation (25), the noise variance estimator (scaling factor) is similar to the form of the first scaling factor derived of equation (24). The first and second exemplary embodiments of the present invention may be employed interchangeably and may be relatively easy to calculate.

A third exemplary embodiment of scaling may be expressly derived based on LUT entry calculation for the max* term of log-MAP decoding. The LUT entries for the logarithmic correction term in log-MAP decoding are generated via equation (26):

$$c \log(1 + e^{-\frac{x}{c}}), \quad (26)$$

where c is $$\frac{A\sigma^2}{4}.$$

The constant A is given by equation (27):

$$A = \frac{C^*(2^{q-1} - 1)}{mag(\sigma)}, \quad (27)$$

where $C^*=0.65$, q is the number of bits defined by the digital quantizing method, and equation (28) gives an approximation for mag(σ):

$$mag(\sigma) \approx \sigma\sqrt{\frac{2}{\pi}} \approx 0.798\sigma. \tag{28}$$

Thus, the LUT entry for the logarithmic correction term may be calculated, and, for scaling, every soft sample divided by c. From equations (26) and (27), the inverse of c is given in equation (29):

$$\frac{1}{c} = \frac{4 * mag(\sigma)}{0.65*(2^{q-1}-1)*\sigma^2} \approx \frac{4*0.798}{0.65*(2^{q-1}-1)*\sigma}. \tag{29}$$

Different approximate slot-based scaling factors may be generated from equation (29) that are not directly RMS-based. Typical quantities of soft sample statistics as known in the art are given in equations (30) and (31):

$$E(|\xi_i|) = mag(\sigma) \approx 0.798\sigma, \text{ and} \tag{30}$$

$$E(|\xi_i|^2) = E_s + \sigma^2 \approx \sigma^2. \tag{31}$$

With these approximations in equations (30) and (31), equation (29) may be re-written as in equation (32):

$$\frac{1}{c} \approx \frac{4*0.798*0.798}{0.65*(2^{q-1}-1)*E(|\xi_i|)}. \tag{32}$$

From equation (32), the slot-based scaling factor of the form given in equation (33) may be employed:

$$\frac{1}{c} \approx \frac{H_i}{E(|\xi_i|)}. \tag{33}$$

where $H_i$ is a constant for a given slot. The slot-based scaling factor of equation (33) may be simpler to implement in practice, and may be adapted to account for AGC and DC offset effects through the constant $H_i$ for a given slot.

However, in accordance with preferred embodiments of the present invention, a slot-based RMS scaling factor for scaling LUT entries may be generated as follows. Given the relation of equation (34):

$$\sqrt{RMS_i} \approx \sqrt{E_s + \sigma^2} = \sigma\sqrt{\frac{E_s}{\sigma^2}+1} = \sigma\sqrt{\frac{SNR}{2}+1}, \tag{34}$$

equation (29) may be written as in equation (35) to provide the slot-based RMS scaling factor:

$$\frac{1}{c} \approx \frac{4*0.798*\sqrt{\frac{SNR}{2}+1}}{0.65*(2^{q-1}-1)*\sqrt{RMS_i}} = \frac{M_i}{\sqrt{RMS_i}}, \tag{35}$$

where $M_i$ is a constant for the ith slot. Equation (35) yields a scaling factor that is explicitly dependent on the SNR values and the operation range, and is again a one-step slot-based RMS value scaling.

Equation (35) may be modified to take into account AGC effects and variations in signal strength, which provide the slot-based RMS scaling factor of equation (36):

$$\frac{1}{c} = \frac{F_1 E(|\xi_i|)}{\sqrt{RMS_i}} = \frac{F_i\left(\frac{1}{3K}\sum_{i=0}^{3K-1}|\xi_i|\right)}{\sqrt{RMS_i}}, \tag{36}$$

where $F_i$ is a constant.

Equation (35) may be modified to take into account DC offset residue in the soft samples, which provides the slot-based RMS scaling factor of equation (37):

$$\frac{1}{c} = \frac{G_i}{\sqrt{RMS_i - [E(\xi_i)]^2}} = \frac{G_i}{\sqrt{RMS_i - \left(\frac{1}{3K}\sum_{i=0}^{3K-1}\xi_i\right)^2}}, \tag{37}$$

where $G_i$ is a control constant that is operation range dependent and may be determined by simulation or calibration.

Figure 2:
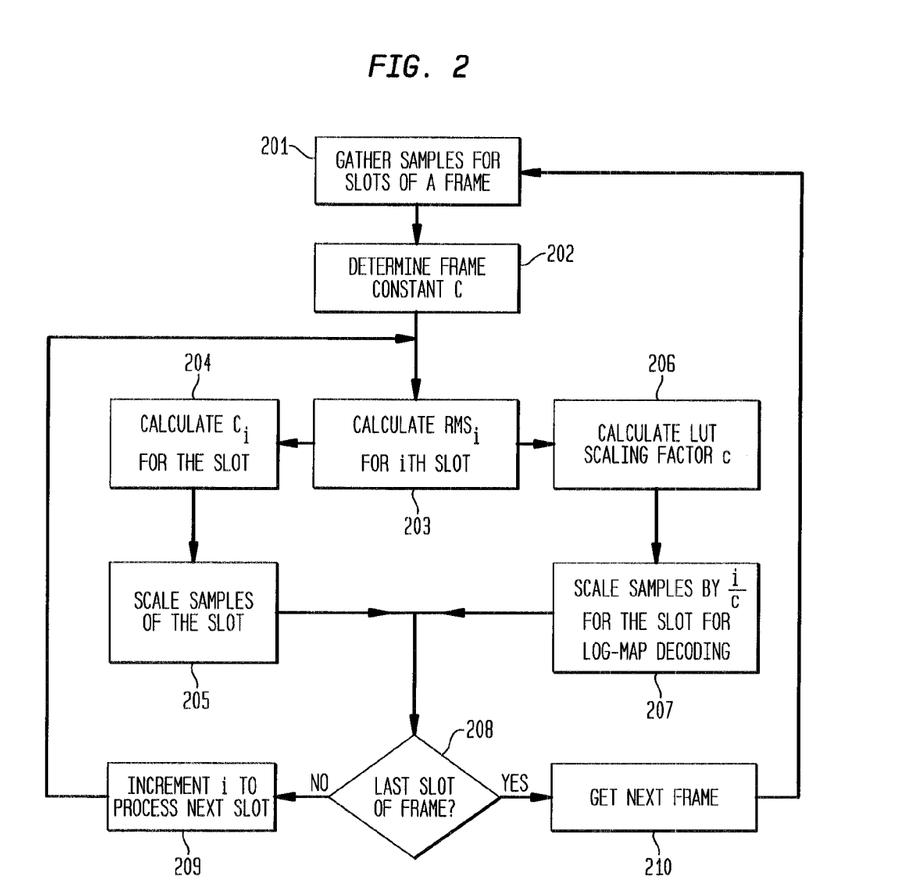
FIG. 2. shows a method of slot-based RMS scaling in accordance with exemplary embodiments of the present invention.

FIG. 2. shows a method of slot-based RMS scaling in accordance with exemplary embodiments of the present invention. At step 201, the samples of the slots in a frame are gathered. At step 202, the frame constant C is determined. At step 203, the $RMS_i$ value for the ith slot is calculated. From step 203, the method may take either of two paths A and B. If the method implements path A from step 203, then, at step 204, the scaling factor $C_i$ for the ith slot is calculated, such as by employing the relation of equation (24). At step 205, the samples of the ith slot are scaled by $C_i$, and the method then advances to step 208. If the method implements path B from step 203, then, at step 206, the LUT scaling factor c for the ith slot is calculated, such as by employing one of the relations of equations (35) through (37). At step 207, the samples of the slot are scaled by the value 1/c. From step 207 the method advances to step 208.

At step 208, a test determines whether the ith slot is the last slot in the frame. If the test of step 208 determines that the ith slot is not the last slot of the frame, the method advances to step 209. At step 209, the counter i is incremented and the method returns to step 203 to process the next slot. If the test of step 208 determines that the ith slot is the last slot of the frame, the method advances to step 210 to get the next frame. From step 210, the method advances to step 201 to begin processing of the next frame.

Slot-based scaling of soft samples may be accomplished within an integrated circuit (IC) implementation, such as an ASIC or DSP implementation. Scaling may be performed as either slot-based pre-channel de-interleaver processing, random based post-channel de-interleaver processing, or decoder-assisted post-channel de-interleaver processing. In slot-based pre-channel de-interleaver processing, scaling modifies channel impairments in their order of occurrence, and slot-based pre-channel de-interleaver processing may be combined with processing by a RAKE receiver (i.e., scale soft samples inside RAKE receiver). Random post-channel de-interleaver processing may be included within the de-interleaver. Decoder-assisted post-channel de-interleaver processing employs online SNR estimation and soft sample scaling within the turbo decoder. These three approaches correspond to the three major components of the CDMA receiver: RAKE receiver, channel de-interleaver, and turbo decoder. Soft samples from a RAKE receiver in CDMA receivers are typically processed on a slot by slot fashion, thus slot-based scaling may be preferred in these systems.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A method of scaling samples of an encoded signal iteratively decoded to generate decoded data, the method comprising the steps of:
   (a) generating a root mean square (RMS) value for samples within a slot;
   (b) calculating a scaling factor based on the RMS value of the slot; and
   (c) scaling the input samples of the slot based on the scaling factor,
   wherein the scaling factor (1/c) is set as:

$$\frac{1}{c} \approx \frac{4*0.798*\sqrt{\frac{SNR}{2}+1}}{0.65*(2^{q-1}-1)*\sqrt{RMS_i}} = \frac{M_i}{\sqrt{RMS_i}},$$

where SNR is a signal-to-noise ratio value, $M_i$ is a constant for the ith slot, q is a number of bits defined by a digital quantizing method, and $RMS_i$ is the RMS value of the samples over the ith slot.

2. The invention of claim 1, wherein, for step (b), the scaling factor is calculated using a scaling constant such that the RMS value of samples after scaling over a frame approximates a predefined value, wherein the frame comprises one or more slots.

3. The invention of claim 1, wherein, for step (b), the scaling factor is a noise variance estimator.

4. The invention of claim 1, wherein step (c) comprises the step of scaling the samples within the slot to adjust a dynamic range of the samples.

5. The invention of claim 1, further comprising the steps of:

b1) estimating a noise variance as a function of the RMS value;
b2) generating a constant for each logarithmic correction term of log-MAP decoding using the estimated noise variance; and
b3) setting the scaling factor based on the constant.

6. The invention of claim 5, wherein step (c) comprises the step of either (c1) adjusting the samples or (c2) adjusting one or more previously generated logarithmic correction terms based on the scaling factor for log-MAP decoding.

7. The invention of claim 1, wherein step (c) comprises the step of either (c1) adjusting the samples or (c2) adjusting one or more previously generated logarithmic correction terms based on the scaling factor for log-MAP decoding.

8. A method of scaling samples of an encoded signal iteratively decoded to generate decoded data, the method comprising the steps of:
   (a) generating a root mean square (RMS) value for samples within a slot;
   (b) calculating a scaling factor based on the RMS value of the slot; and
   (c) scaling the input samples of the slot based on the scaling factor,
   wherein the scaling factor (1/c) accounts for automatic gain control (AGC) and is set as:

$$\frac{1}{c} = \frac{F_i E(|\xi_i|)}{\sqrt{RMS_i}} = \frac{F_i\left(\frac{1}{3K}\sum_{i=0}^{3K-1}|\xi_i|\right)}{\sqrt{RMS_i}},$$

where $F_i$ is a constant for the slot, K is a number of samples per slot, $RMS_i$ is the RMS value of the samples over the ith slot, E(●) denotes mathematical "expected value of", and $\xi_i$ is the sequence of input soft samples in the slot.

9. The invention of claim 8, further comprising the steps of:

b1) estimating a noise variance as a function of the RMS value;
b2) generating a constant for each logarithmic correction term of log-MAP decoding using the estimated noise variance; and
b3) setting the scaling factor based on the constant.

10. The invention of claim 8, wherein, for step (b), the scaling factor is calculated using a scaling constant such that the RMS value of samples over a frame approximates a predefined value, wherein the frame comprises one or more slots.

11. The invention of claim 8, wherein, for step (b), the scaling factor is a noise variance estimator.

12. The invention of claim 8, wherein step (c) comprises the step of scaling the samples within the slot to adjust a dynamic range of the samples.

13. The invention of claim 8, wherein step (c) comprises the step of either (c1) adjusting the samples or (c2) adjusting one or more previously generated logarithmic correction terms based on the scaling factor for log-MAP decoding.

14. A method of scaling samples of an encoded signal iteratively decoded to generate decoded data, the method comprising the steps of:
   (a) generating a root mean square (RMS) value for samples within a slot;
   (b) calculating a scaling factor based on the RMS value of the slot; and (c) scaling the input samples of the slot based on the scaling factor, wherein:

the scaling factor (1/c) accounts for DC offset signals present within the samples; and the scaling factor (1/c) accounting for DC offset is set as:

$$\frac{1}{c} = \frac{G_i}{\sqrt{RMS_i - [E(\xi_i)]^2}} = \frac{G_i}{\sqrt{RMS_i - \left(\frac{1}{3K}\sum_{i=0}^{3K-1}\xi_i\right)^2}},$$

where $G_i$ is a control constant for the slot, K is a number of samples per slot, $RMS_i$ is the RMS value of the samples over the ith slot, $E(\bullet)$ denotes mathematical "expected value of", and $\xi_i$ is the sequence of input soft samples in the slot.

15. The invention of claim 14, further comprising the steps of:

b1) estimating a noise variance as a function of the RMS value;

b2) generating a constant for each logarithmic correction term of log-MAP decoding using the estimated noise variance; and b3) setting the scaling factor based on the constant.

16. The invention of claim 14, wherein, for step (b), the scaling factor is calculated using a scaling constant such that the RMS value of samples over a frame approximates a predefined value, wherein the frame comprises one or more slots.

17. The invention of claim 14, wherein, for step (b), the scaling factor is a noise variance estimator.

18. The invention of claim 14, wherein step (c) comprises the step of scaling the samples within the slot to adjust a dynamic range of the samples.

19. The invention of claim 14, wherein step (c) comprises the step of either (c1) adjusting the samples or (c2) adjusting one or more previously generated logarithmic correction terms based on the scaling factor for log-MAP decoding.

20. A method of scaling samples of an encoded signal iteratively decoded to generate decoded data, the method comprising the steps of:

(a) generating a root mean square (RMS) value for samples within a slot wherein the RMS is approximately $E[|\xi_i|^2]$;

(b) calculating a scaling factor based on the RMS value of the slot; and (c) scaling the input samples of the slot based on the scaling factor, wherein the scaling factor (1/c) is set as:

$$\frac{1}{c} \approx \frac{H_i}{E(|\xi_i|)},$$

where $H_i$ is a constant for a given slot, $E(\bullet)$ denotes mathematical "expected value of", and $\xi_i$ is the sequence of input soft samples in the slot.

21. The invention of claim 20, wherein, for step (b), the scaling factor is calculated using a scaling constant such that the RMS value of samples after scaling over a frame approximates a predefined value, wherein the frame comprises one or more slots.

22. The invention of claim 20, wherein, for step (b), the scaling factor is a noise variance estimator.

23. The invention of claim 20, wherein step (c) comprises the step of scaling the samples within the slot to adjust a dynamic range of the samples.

24. The invention of claim 20, further comprising the steps of:

b1) estimating a noise variance as a function of the RMS value;

b2) generating a constant for each logarithmic correction term of log-MAP decoding using the estimated noise variance; and b3) setting the scaling factor based on the constant.

25. The invention of claim 20, wherein step (c) comprises the step of either (c1) adjusting the samples or (c2) adjusting one or more previously generated logarithmic correction terms based on the scaling factor for log-MAP decoding.

26. A method of scaling samples of an encoded signal iteratively decoded to generate decoded data, the method comprising the steps of:

(a) generating a root mean square (RMS) value for samples within a slot;

(b) calculating a scaling factor based on the RMS value of the slot; and (c) scaling the input samples of the slot based on the scaling factor, wherein:

the scaling factor accounts for at least one of automatic gain control (AGC) and DC offset signals present within the samples; and the scaling factor (1/c) accounting for AGC is set as:

$$\frac{1}{c} = \frac{F_i E(|\xi_i|)}{\sqrt{RMS_i}} = \frac{F_i\left(\frac{1}{3K}\sum_{i=0}^{3K-1}|\xi_i|\right)}{\sqrt{RMS_i}},$$

where $F_i$ is a constant for the slot, K is a number of samples per slot, $RMS_i$ is the RMS value of the samples over the ith slot, $E(\bullet)$ denotes mathematical "expected value of", and $\xi_1$ is the sequence of input soft samples in the slot.

27. A method of scaling samples of an encoded signal iteratively decoded to generate decoded data, the method comprising the steps of:

(a) generating a root mean square (RMS) value for samples within a slot;

(b) calculating a scaling factor based on the RMS value of the slot; and (c) scaling the input samples of the slot based on the scaling factor, wherein:

the scaling factor accounts for at least one of automatic gain control (AGC) and DC offset signals present within the samples; and the scaling factor (1/c) accounting for DC offset is set as:

$$\frac{1}{c} = \frac{G_i}{\sqrt{RMS_i - [E(\xi_i)]^2}} = \frac{G_i}{\sqrt{RMS_i - \left(\frac{1}{3K}\sum_{i=0}^{3K-1}\xi_i\right)^2}},$$

where $G_i$ is a control constant for the slot, K is a number of samples per slot, $RMS_i$ is the RMS value of the samples over the ith slot, $E(\bullet)$ denotes mathematical "expected value of", and $\xi_i$ is the sequence of input soft samples in the slot.

28. A method of scaling samples of an encoded signal iteratively decoded to generate decoded data, the method comprising the steps of:
 (a) generating a root mean square (RMS) value for samples within a slot;
 (b) calculating a scaling factor based on the RMS value of the slot; and
 (c) scaling the input samples of the slot based on the scaling factor,
wherein:
 step (b) further comprises the steps of:
  b1) estimating a noise variance as a function of the RMS value;
  b2) generating a constant for each logarithmic correction term of log-MAP decoding using the estimated noise variance; and
  b3) setting the scaling factor based on the constant;
 the scaling factor accounts for at least one of automatic gain control (AGC) and DC offset signals present within the samples; and
 the scaling factor (1/c) accounting for AGC is set as:

$$\frac{1}{c} = \frac{F_i E(|\xi_i|)}{\sqrt{RMS_i}} = \frac{F_i\left(\frac{1}{3K}\sum_{i=0}^{3K-1}|\xi_i|\right)}{\sqrt{RMS_i}},$$

where $F_i$ is a constant is a constant for the slot, $RMS_i$ is the RMS value of the samples over the ith slot, $E(\bullet)$ denotes mathematical "expected value of", and $\xi_i$ is the sequence of input soft samples in the slot.

29. A method of scaling samples of an encoded signal iteratively decoded to generate decoded data, the method comprising the steps of:
 (a) generating a root mean square (RMS) value for samples within a slot;
 (b) calculating a scaling factor based on the RMS value of the slot; and
 (c) scaling the input samples of the slot based on the scaling factor,
 wherein the scaling factor accounts for at least one of automatic gain control (AGC) and DC offset signals present within the samples;
wherein:
 step (b) further comprises the steps of:
  b1) estimating a noise variance as a function of the RMS value; and
  b2) generating a constant for each logarithmic correction term of log-MAP decoding using the estimated noise variance; and
  b3) setting the scaling factor based on the constant;
 the scaling factor (1/c) accounting for DC offset is set as:

$$\frac{1}{c} = \frac{G_i}{\sqrt{RMS_i - [E(\xi_i)]^2}} = \frac{G_i}{\sqrt{RMS_i - \left(\frac{1}{3K}\sum_{i=0}^{3K-1}\xi_i\right)^2}},$$

where $G_i$ is a control constant for the slot, K is a number of samples per slot, $RMS_i$ is the RMS value of the samples over the ith slot, $E(\bullet)$ denotes mathematical "expected value of", and $\xi_i$ is the sequence of input soft samples in the slot.

* * * * *